(12) United States Patent
Singh

(10) Patent No.: US 10,014,192 B2
(45) Date of Patent: Jul. 3, 2018

(54) APPARATUS FOR ATOMIC LAYERING ETCHING

(71) Applicant: Harmeet Singh, Fremont, CA (US)

(72) Inventor: Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 269 days.

(21) Appl. No.: 14/103,688

(22) Filed: Dec. 11, 2013

(65) Prior Publication Data

US 2015/0206774 A1    Jul. 23, 2015

Related U.S. Application Data

(62) Division of application No. 13/187,437, filed on Jul. 20, 2011, now Pat. No. 8,617,411.

(51) Int. Cl.
*H01L 21/67* (2006.01)
*H01L 21/3065* (2006.01)
(Continued)

(52) U.S. Cl.
CPC .... *H01L 21/67069* (2013.01); *H01J 37/3244* (2013.01); *H01J 37/32082* (2013.01);
(Continued)

(58) Field of Classification Search
CPC ......... H01L 21/67069; H01L 21/76814; H01L 21/3065; H01J 37/3244; H01J 37/32899;
(Continued)

(56) References Cited

U.S. PATENT DOCUMENTS

| | | | |
|---|---|---|---|
| 4,756,794 | A | 7/1988 | Yoder |
| 5,002,632 | A | 3/1991 | Loewenstein et al. |

(Continued)

FOREIGN PATENT DOCUMENTS

| | | |
|---|---|---|
| GB | 2269785 | 2/1994 |
| JP | S61-171133 | 8/1986 |

(Continued)

OTHER PUBLICATIONS

Japanese Office Action dated May 17, 2016 from Japanese Application No. 2014-521657.

(Continued)

*Primary Examiner* — Rudy Zervigon
(74) *Attorney, Agent, or Firm* — Beyer Law Group LLP

(57) ABSTRACT

A substrate processing system having a processing chamber for etching a layer on a substrate is provided. The system includes a chuck upon which the substrate is disposed during etching. The system also includes the chamber being divided into a plasma generating region and a substrate processing region by a separating plate structure. The system further includes a plasma source for generating plasma in the plasma generating region. The system further includes logic for introducing a first gas into the chamber, wherein the gas is suitable for etching the layer. The logic also allows the first gas to be present in the chamber for a period of time sufficient to cause adsorption of at least some of the first gas into the layer. The logic further replaces the first gas with an inert gas, generates metastables from the inert gas, and etches the layer with the metastables.

22 Claims, 4 Drawing Sheets

(51) Int. Cl.
    H01L 21/768    (2006.01)
    H01J 37/32     (2006.01)
(52) U.S. Cl.
    CPC .. H01J 37/32449 (2013.01); H01J 37/32458 (2013.01); H01J 37/32633 (2013.01); H01J 37/32715 (2013.01); H01J 37/32899 (2013.01); H01L 21/3065 (2013.01); H01L 21/76814 (2013.01); *H01J 2237/334* (2013.01)
(58) Field of Classification Search
    CPC .......... H01J 37/32715; H01J 37/32458; H01J 37/32633; H01J 37/32449; H01J 37/32082; H01J 2237/334
    USPC ............ 156/345.25, 345.26, 345.38, 345.39, 156/345.4; 118/723 R
    See application file for complete search history.

(56)          References Cited

U.S. PATENT DOCUMENTS

| | | | | |
|---|---|---|---|---|
| 5,108,535 | A * | 4/1992 | Ono | H05H 1/46 118/723 IR |
| 5,284,544 | A * | 2/1994 | Mizutani | H01J 37/32357 118/723 FI |
| 5,518,572 | A * | 5/1996 | Kinoshita | G21K 1/14 118/723 E |
| 5,811,022 | A * | 9/1998 | Savas | H01J 37/321 118/723 I |
| 5,874,013 | A | 2/1999 | Tokunaga et al. | |
| 5,976,992 | A | 11/1999 | Ui et al. | |
| 6,143,129 | A * | 11/2000 | Savas | H01J 37/321 156/345.48 |
| 6,162,323 | A * | 12/2000 | Koshimizu | H01J 37/3244 118/723 I |
| 6,464,891 | B1 * | 10/2002 | Druz | C23C 14/0605 134/1 |
| 6,500,314 | B1 * | 12/2002 | DeOrnellas | H01J 37/32082 204/192.1 |
| 6,551,447 | B1 * | 4/2003 | Savas | H01J 37/321 118/723 I |
| 6,935,269 | B2 * | 8/2005 | Lee | H01J 37/32357 118/723 AN |
| 7,244,474 | B2 * | 7/2007 | Hanawa | C23C 16/402 118/723 ER |
| 7,381,943 | B2 * | 6/2008 | Lee | H01J 37/32422 156/345.34 |
| 7,695,590 | B2 * | 4/2010 | Hanawa | C23C 14/358 118/723 E |
| 7,871,678 | B1 * | 1/2011 | Greer | C23C 16/34 118/23 |
| 8,053,372 | B1 * | 11/2011 | Greer | C23C 16/45523 427/255.23 |
| 8,475,672 | B2 * | 7/2013 | Iori | H01J 37/32357 204/298.37 |
| 8,480,850 | B2 * | 7/2013 | Tyler | H01J 37/32082 118/723 E |
| 8,617,411 | B2 * | 12/2013 | Singh | H01L 21/3065 216/62 |
| 9,157,152 | B2 * | 10/2015 | Faguet | C23C 16/452 |
| 9,373,517 | B2 * | 6/2016 | Yang | H01L 21/3065 |
| 2001/0023744 | A1 * | 9/2001 | Komino | C23C 16/4405 156/345.44 |
| 2003/0116277 | A1 * | 6/2003 | Chi | H01J 37/08 156/345.4 |
| 2004/0173316 | A1 * | 9/2004 | Carr | C23C 16/511 156/345.41 |
| 2006/0196847 | A1 * | 9/2006 | Honda | C23F 4/00 216/67 |
| 2007/0068624 | A1 * | 3/2007 | Jeon | H01J 37/321 156/345.4 |
| 2007/0084991 | A1 * | 4/2007 | Lee | H01J 37/32422 250/251 |
| 2007/0163994 | A1 * | 7/2007 | Rauf | H01J 37/32357 216/62 |
| 2007/0286967 | A1 * | 12/2007 | Ide | C23C 16/5096 427/569 |
| 2009/0029564 | A1 * | 1/2009 | Yamashita | H01J 37/32192 438/788 |
| 2009/0084502 | A1 | 4/2009 | Hayashi | |
| 2010/0273315 | A1 * | 10/2010 | Ovshinsky | H01L 21/0262 438/478 |
| 2011/0027999 | A1 * | 2/2011 | Sparks | C23F 4/00 438/712 |
| 2011/0139748 | A1 * | 6/2011 | Donnelly | H01J 37/32036 216/37 |
| 2011/0192820 | A1 * | 8/2011 | Yeom | H01J 37/32009 216/67 |
| 2011/0309050 | A1 * | 12/2011 | Iori | H01J 37/32357 216/67 |
| 2012/0048831 | A1 * | 3/2012 | Rueger | H01J 37/32009 216/67 |
| 2012/0258601 | A1 * | 10/2012 | Holland | H01J 37/32357 438/729 |
| 2012/0258606 | A1 * | 10/2012 | Holland | H01J 37/35357 438/798 |
| 2012/0258607 | A1 * | 10/2012 | Holland | H01J 37/32357 438/798 |
| 2013/0023125 | A1 * | 1/2013 | Singh | H01L 21/3065 438/706 |
| 2014/0004708 | A1 * | 1/2014 | Thedjoisworo | H01L 21/3065 438/723 |
| 2014/0202633 | A1 * | 7/2014 | Godet | H01L 21/32366 156/345.35 |
| 2014/0262038 | A1 * | 9/2014 | Wang | H01L 21/6708 156/345.35 |
| 2015/0200042 | A1 * | 7/2015 | Ling | H01B 19/04 216/13 |
| 2015/0206774 | A1 * | 7/2015 | Singh | H01L 21/3065 156/345.35 |
| 2016/0013067 | A1 * | 1/2016 | Wang | H01L 21/32136 438/702 |
| 2016/0135274 | A1 * | 5/2016 | Fischer | H05G 2/003 438/9 |
| 2016/0163557 | A1 * | 6/2016 | Hudson | H01L 21/30655 438/696 |
| 2016/0203995 | A1 * | 7/2016 | Kanarik | H01L 21/0228 438/703 |

FOREIGN PATENT DOCUMENTS

| | | |
|---|---|---|
| JP | 3-155132 | 7/1991 |
| JP | 5-275378 | 10/1993 |
| JP | 6-252108 | 9/1994 |
| JP | 7-263424 | 10/1995 |
| JP | 8-31804 | 2/1996 |
| JP | 9-223684 | 8/1997 |
| JP | H09-326383 | 12/1997 |
| JP | 2002-289584 | 10/2002 |
| JP | 2009-88284 | 4/2009 |
| WO | 02/078044 | 10/2002 |

OTHER PUBLICATIONS

Japanese Office Action dated Dec. 6, 2016 from Japanese Patent Application No. 2014-521657.
Written Opinion from Singapore Application No. 1020160572P dated Aug. 2, 2017.
Search Report from Singapore Application No. 1020160572P dated May 16, 2017.

\* cited by examiner

APPARATUS FOR ATOMIC LAYERING ETCHING

PRIORITY CLAIM

This continuation application darns priority under 37 CFR 1.53(b) of and claims the benefit under 35 U.S.C. § 120 to a commonly assigned patent application entitled "METHODS AND APPARATUS FOR ATOMIC LAYERING ETCHING", by Harmeet Singh, filed on Jul. 20, 2011 (application Ser. No. 13/187,437), which are incorporated herein by reference.

BACKGROUND OF THE INVENTION

Atomic layer etching is a technique known in the art to perform critical etching with very fine precision for semiconductor device manufacture. In atomic layer etching, etching is performed on a thin layer while attempting to avoid undue sub-surface damage or undesirable modifications. Atomic layer etching may be performed to etch a very thin layer that overlays another critical layer, for example. Atomic layer etching may also be employed, for example, at the end of a bulk etch step while attempting to clear a layer while ensuring that the etching of the thin remaining layer does not result in damage to the underlying layer and/or underlying structures.

To elaborate, it is known that etching using plasma has the potential of inducing the aforementioned sub-surface damage or modification to the underlying structures and/or underlying layer. Loss of silicon below the gate dielectric during plasma etching is an example of sub-surface loss, i.e. Si recess occurring during gate etch even though thin gate dielectric (commonly SiO2) is present. In some situations, plasma etching with ion energies greater than 100 eV has been known to induce damage to about 20-40 Angstroms depth below the surface. Thus with typical gate oxide thickness around 10 angstroms, it is common to observe Si recess of about 10-20 angstroms post gate etch.

The present invention relates to improves apparatuses and methods for performing atomic layer etching in semiconductor device manufacture.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
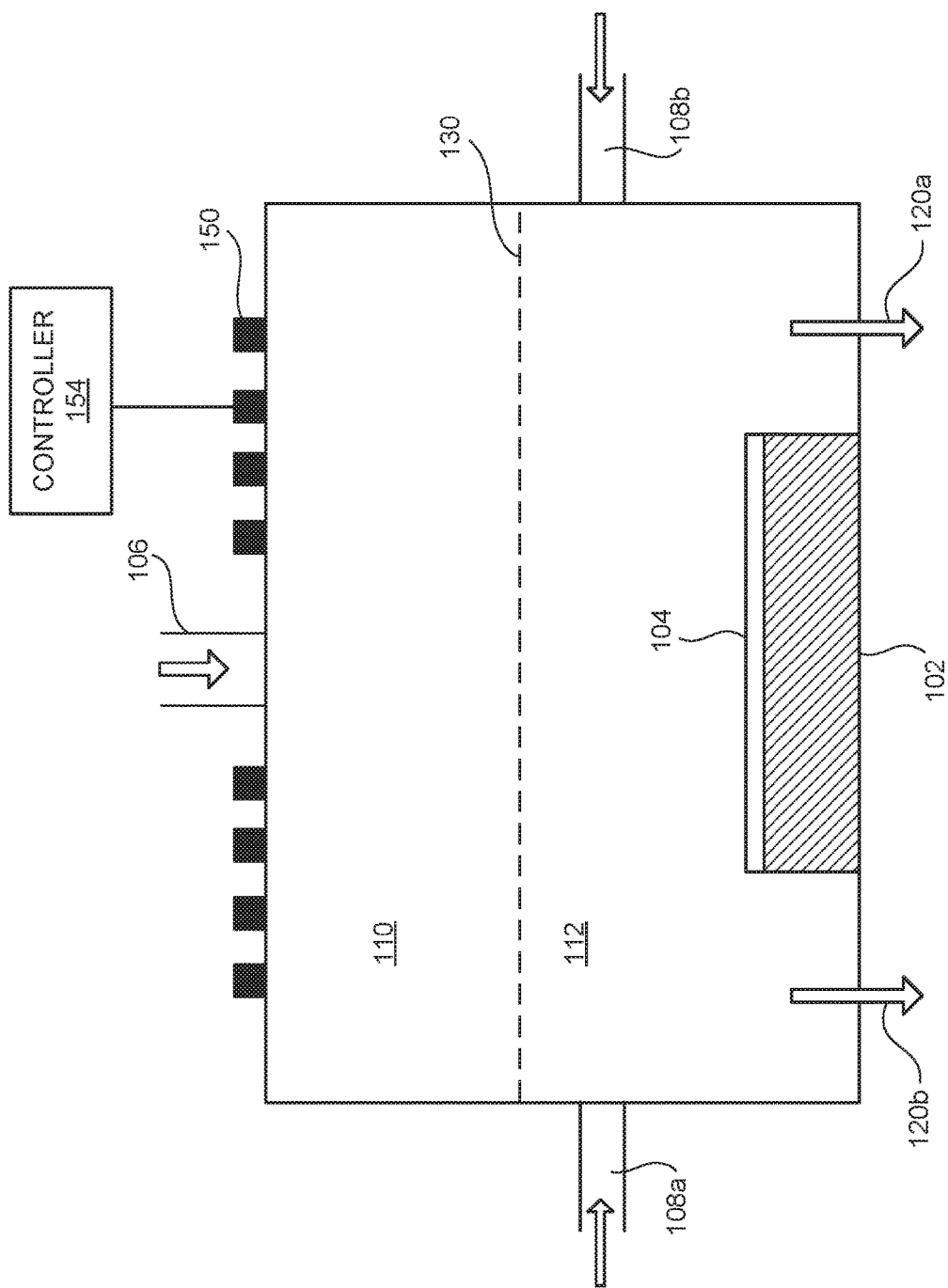
Fig. 1 shows an example substrate processing chamber suitable for performing atomic layer etching in accordance with one or more embodiments of the invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of as computer/computing device and dedicated/programmable circuits adapted for the various tasks pertaining to embodiments of the invention.

Embodiments of the invention relate to apparatuses and methods for performing atomic layer etching on a layer of a substrate (such as a semiconductor wafer or a flat panel). In one or more embodiments, an etchant source gas that is suitable for etching the substrate layer is introduced into the semiconductor processing chamber. To etch a Si layer, for example, the etchant gas may be one of or a mixture of $Cl_2$, HCl, $CHF_3$, $CH_2F_2$, $CH_3F$, $H_2$, $BCl_3$, $SiCl_4$, $Br_2$, HBr, $NF_3$, $CF_4$, $SF_6$, $O_2$, $SO_2$, COS, etc. The etchant gas is allowed to be present in the chamber for a sufficient amount of time to permit at least some of the etchant gas material to be adsorbed into the layer to be etched. Subsequently, the etchant gas is replaced by an inert gas (such as one of or a mixture of Ar, He, Kr, Ne, Xe, etc.). Metastables are then formed from the inert gas to perform atomic layer etch on the substrate layer. The cycle may he repeated more than once until atomic layer etching is completed.

In one or more embodiments, the metastables are formed by igniting a plasma out of the inert gas in a plasma generating region of the chamber. Metastables then migrate from the plasma generated in the plasma generating region through holes in a separating plate to contact the substrate layer. The energetic plasma ions arc, however, prevented from contacting the surface of the wafer to minimize unintentional etching and/or sub-surface damage and/or modifications of the underlying layer. During atomic layer etching, the substrate is disposed in the wafer processing region of the chamber and on a chuck. Upon contacting the substrate layer surface, the metastables are de-excited, and in the process, give up their electronic energy to cause surface reactions at the adsorbed substrate surface, thereby etching the substrate surface. Since the directed energy of metastables tends to be much lower (e.g., about 0.025 eV for argon metastables) than the 100-1000 eV of energy of energetic ions of the plasma, damage is substantially minimized when etching using a combination of inert gas metastables and adsorbed layer.

In one or more embodiments, the aforementioned separating plate is a multi-plate structure with the plates electrically insulated from one another. In one or more embodiments, at least one of the plates of the multi-plate assembly is biased to repel the ions emanating from the plasma. Each of the plates of the multi-plate assembly has through-holes to permit metastables to traverse through from the plasma generating region to the wafer processing region. The through-holes of the plates may be aligned in one embodiment or may be slightly offset if desired. The through holes of the separating plate are sized to substantially prevent energetic plasma species from traversing the separating plate and from reaching the substrate surface.

In one or more embodiments, a collimator plate is disposed between the separating plate and the substrate to collimate the metastables, thereby allowing only substantially directional metastables to reach the substrate surface to render the etch more anisotropic, i.e., in the vertical direction that is perpendicular to the substrate plane. The collimator plate may include through-holes and may be grounded or biased as desired.

To prevent non-uniform etching of the surface due to the hole pattern(s) of the separation plate and/or the collimator plate, the separation plate and/or the collimator plate may he moved relative to the substrate (or vice versa). The relative lateral movement of the separation plate and/or the collimator plate and/or the wafer & wafer chuck assembly has the effect of preventing the through-hole patterns of the separation plate or the collimator plate from being imprinted only on certain areas of the substrate surface.

One or inure embodiments of the invention cover the methods for performing the atomic layer etch as described herein. One or more embodiments of the invention cover the substrate processing system and/or substrate processing chamber having the hardware described herein and may also include logic (which may be implemented via dedicated logic circuits, programmable logic circuits, and/or by a microprocessor/microcontroller/computer controlled by computer readable code embodied in a computer readable medium and/or transmitted to the microprocessor/microcontroller/computer for execution as digital signals over a bus or a digital network (including a local area network and/or the internet).

The features and advantages of embodiments of the invention may be understood with reference to the figures and discussions that follow.

Embodiments of the invention employ metastables of one or more inert gases to activate surface reactions with reactant (e.g., halogen) that has been adsorbed in the substrate layer (e.g., a Si layer). Although the Si layer is employed as an example herein, it should be understood that any layer may be etched using the atomic etch technique of embodiments of the invention. In one or more embodiments, the surface of the wafer is exposed to an etchant gas (e.g., one of or a mixture of $Cl_2$, HCl, $CHF_3$, $CH_2F_2$, $CH_3F$, $H_2$, $BCl_3$, $SiCl_4$, $Br_2$, HBr, $NF_3$, $CF_4$, $SF_6$, $O_2$, $SO_2$, COS, etc.). In one or more embodiments, the substrate processing chamber may be filled with an etchant gas or a mixture of etchant gases for a short time (about 0.05 seconds to about 180 seconds) to allow the etchant gas molecules to adsorb on the substrate surface. In one or more embodiments, the substrate processing chamber may he filled with an etchant gas or a mixture of etchant gases for about 0.25 seconds to about 5 seconds to allow the etchant gas molecules to adsorb on the substrate surface.

FIG. 1 shows, in accordance with an embodiment of the invention, an example substrate processing chamber including a chuck 102 on which a substrate 104 (such as a wafer) is disposed. Either gas inlet 106 or 108a/108b or both inlets 106 and 108a/108b may he used to inject the gases into the chamber. In one or more embodiments, inert gas(es) such as one of or a mixture of Ar, He, Kr, Ne, Xe, etc. is injected into plasma generating region 110 via gas inlet 106 while etchant gases are introduced into substrate processing region 112 via gas inlet 108a/ 108b to ensure etchant gases do not enter plasma generating region 110. In this situation, it is preferable that the pressure in plasma generating region 110 is at least equal to or exceeds the pressure in substrate processing region 112. Plasma generating region 110 is separated from substrate processing region 112 at least by a separating plate structure 130 (and optionally by a collimator plate as will be discussed later herein).

In the next step, after the etchant gas has had sufficient time to adsorb on the substrate surface, the etchant gas is evacuated by chamber exhaust pump 120a/120b. This may be done in conjunction with introduction of inert gas(es) into plasma generating region 110 via gas inlet 106. If etchant gas evacuation is done without concurrent inert gas flow, the next step may involve flowing inert gases) into plasma generating region 110 through gas inlet 106.

Upon substantially replacing the etchant gas from the chamber with inert gas, inert was plasma is generated in the plasma chamber and more specifically in plasma generating region 110. In one embodiment, the etchant gas is said to be substantially replaced by the inert gas if at least 80% of the etchant gas is replaced with the inert gas. In one embodiment, the etchant gas is said to be substantially replaced by the inert gas if at least 90% of the etchant gas is replaced with the inert gas. In one embodiment, the etchant gas is said to be substantially replaced by the inert gas if at least 95% of the etchant gas is replaced with the inert gas. In one embodiment, the etchant gas is said to be substantially replaced by the inert gas if at least 99% of the etchant gas is replaced with the inert gas.

Metastable species generated in the plasma transit through the separation plate structure 130 into substrate processing region 112. Pressure in substrate processing region 112 may be controlled using, for example, the turbo molecular pump, a pressure control valve, the design of the separation plate and the inert gas flow.

In one or more embodiments, it is desirable to keep the pressure in the substrate processing region to <10 mTorr such that a significant fraction of metastables entering the water processing region are able to impact the substrate without getting quenched through gas phase collisions in the wafer processing chamber. In one embodiment. the distance between the separation plate and the substrate may he maintained between about 1 cm and 25 cm, for example.

The plasma source for generating the metastables can be selected from various technologies, including inductively coupled plasma (ICP), capacitively coupled plasma, an array of Hollow cathode discharges, microwave plasma or electron cyclotron resonance (ECR) plasma or any other suitable plasma source technology.

FIG. 1 also shows an inductively coupled plasma source 150, representing the antenna for inductively coupling RF energy with the plasma generated in the plasma generating region 110. In a preferred embodiment, ICP (Inductively Coupled Plasma) or ECR (Electron Cyclotron Resonance) plasma sources may be employed due to their ability to generate high density plasmas at low pressures. In one or more embodiments, the pressure in plasma generating region 110 is between about 0.5 mTorr and about 100 mTorr. A controller 154, which comprises a microprocessor, microcontroller, or computer with logic, is controllably connected to the inductively coupled plasma source 150.

Separating plate structure 130 is designed to act as a grounded surface to limit the amount of plasma leaking through the holes in the separating plate(s) by substantially preventing plasma charged species from reaching the substrate. In one embodiment, the separating plate structure is said to substantially prevent plasma charged species from reaching the substrate if at least 60% of the plasma charged species that would have otherwise reached the substrate surface is prevented from reaching the substrate by the separating plate structure. In one embodiment, the separating plate structure is said to substantially prevent plasma charged species from reaching the substrate if at least 80% of the plasma charged species that would have, otherwise reached the substrate surface is prevented from reaching the substrate by the separating plate structure. In one embodiment, the separating plate structure is said to substantially prevent plasma charged species from reaching the substrate if at least 95% of the plasma charged species that would have otherwise reached the substrate surface is prevented from reaching the substrate by the separating plate structure. In one embodiment, the separating plate structure is said to substantially prevent plasma charged species from reaching the substrate if at least 99% of the plasma charged species that would have otherwise reached the substrate surface is prevented from reaching the substrate by the separating plate structure.

The plate(s) of separating plate structure 130 may be fabricated out of metals (e.g., aluminum or stainless steel or to similarly suitable material) or metals coated with films (e.g., anodized aluminum, aluminum coated with Y2O3, YF3, CeO2, Si, TiN). The thickness of the separation plate may be between 1 mm and 25 mm, in one or more embodiments. The diameter of the holes in the separation plate may be chosen to minimize or substantially prevent plasma leakage through the holes, and may he between 20 um and 5 mm in one or more embodiments.

Figure 2:
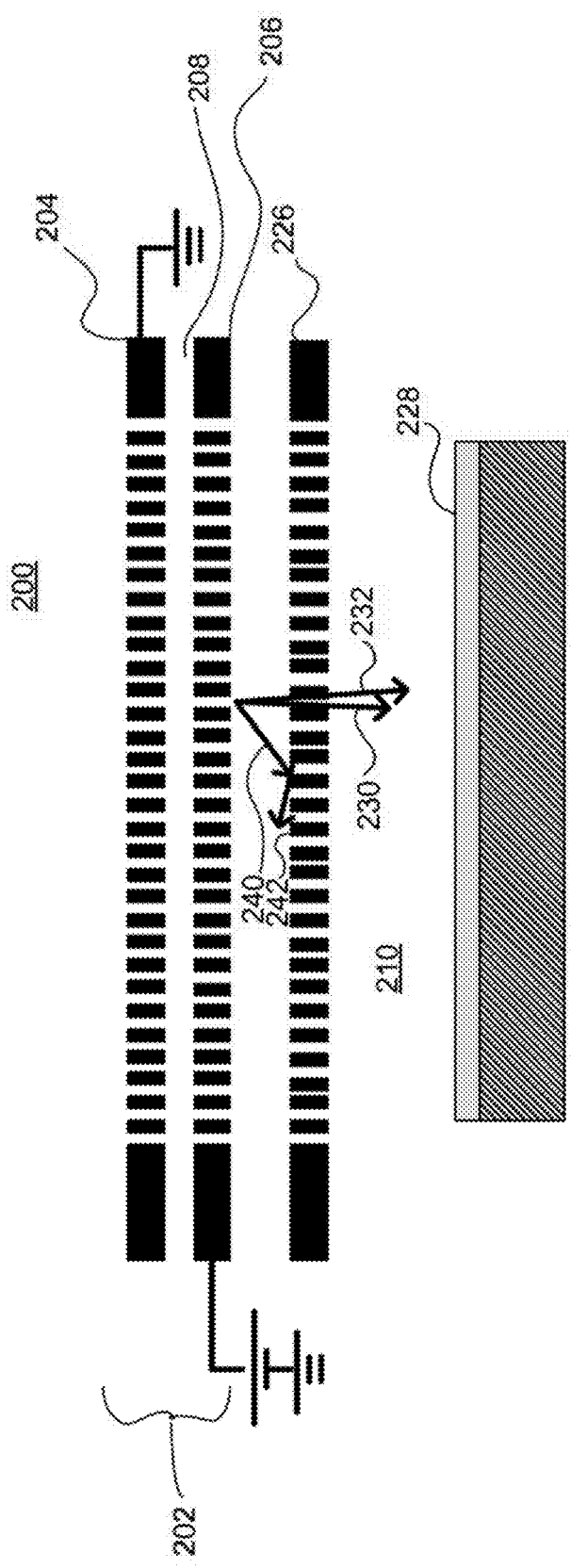
FIG. 2 shows an example the separating plate structure and the optional collimator plate in accordance with one or more embodiments of the invention.

In one or more embodiments, separation plate structure 202 is a multi-layer structure (as shown in FIG. 2 in accordance with an embodiment of the invention) whereby two conductive plates 204 and 206 are separated h an insulating layer 208 so as to be electrically insulated from one another. Top plate 204 is in contact with the plasma in plasma generating region 200 and is electrically grounded. Bottom plate 206 may he biased with a small DC voltage to repel the ions emanating from the plasma. The applied bias voltage on bottom plate 206 may be greater than the plasma potential to prevent majority of the ions from reaching substrate processing region 210 above substrate 228. The applied voltage on bottom plate 206 may be between about 10V and about 50V, in one or more embodiments.

In one or more embodiments, a collimator plate 226 in the form of, for example, a mesh, maybe disposed between separation plate structure 202 and substrate 228 to repel any plasma charged species transiting through separating plate structure 202 from reaching substrate 228. Collimator plate 226 may be biased to repel the plasma charged species or may be grounded, if desired. In another embodiment, substrate 228 may be biased positive relative to the plasma potential to prevent plasma charged species from reaching substrate 228.

Separation plate structure 202 also acts to collimate the neutral beam emanating towards substrate 228. By maintaining the pressure below 10 mTorr, preferably <1 mTorr over substrate 228, in one or more embodiments, collisions between gas emanating from separation plate structure 202 and the gas m substrate processing region 210 above wafer 228 is minimized since the neutral mean free path at 1 mTorr is around 25 cm. This ensures that the metastables arrive at the surface of wafer 22 without any significant collisions during the transit from separating plate structure 202 to substrate 228.

Embodiments of the invention employ a flux of inert metastable atoms arriving on the wafer surface that is already adsorbed and/or saturated with reaction species (e.g., halogens). Metastable atoms carry significant electronic energy to the wafer to induce chemical reactions. Ar metastable atoms (Ar*, wherein the "*" denotes a metastable form) carry, for example, around 11.7 eV energy. This energy is delivered to the wafer surface when Ar* atoms interact with the surface.

Since Ar* atoms travel at close to the thermal gas velocity (0.025 eV), metastable atoms impart a much smaller momentum and bombardment to the surface compared to energetic ions (100-1000 eV), which are typically used in etching plasmas. It is respectfully submitted that Ar* atoms are substantially incapable of causing surface damage upon impact on the wafer, in many cases.

To achieve highly directed etching, the beam of Ar and Ar* atoms can be further collimated using another perforated plate as shown in FIG. 2. In this embodiment, a collimator plate 226 with substantially the same hole pattern as that of separation plate(s) 204 and 206 is placed a small distance away from separation plate structure 202. Collimator plate 226 is aligned such that Ar* traveling along the axis of the separation plate (i.e., perpendicular to the separation plate plane) toward substrate 228 have line of sight to the wafer from the plasma in the plasma generating; region.

More generally, Ar* travelling only in a cone with a small angle (preferably less than +/−3 degrees and more preferably less than +/−0.5 degree) relative to this vertical axis (defined as the axis perpendicular to the separating plate plane) can pass through collimator plate 226 without any collisions with collimator plate 226. These Ar* atoms are shown by arrows 230 and 232. All other Ar* atoms (240 and 242) travelling at a higher angle relative to the vertical axis suffer collisions with the collimator plate and are de-excited, thereby turning into Ar ground state upon collision. This scheme allows for a vertically directed flux of Ar* to impinge on the wafer surface (along with Ar atoms) to create a more vertical, more anisotropic etch.

Figure 3:
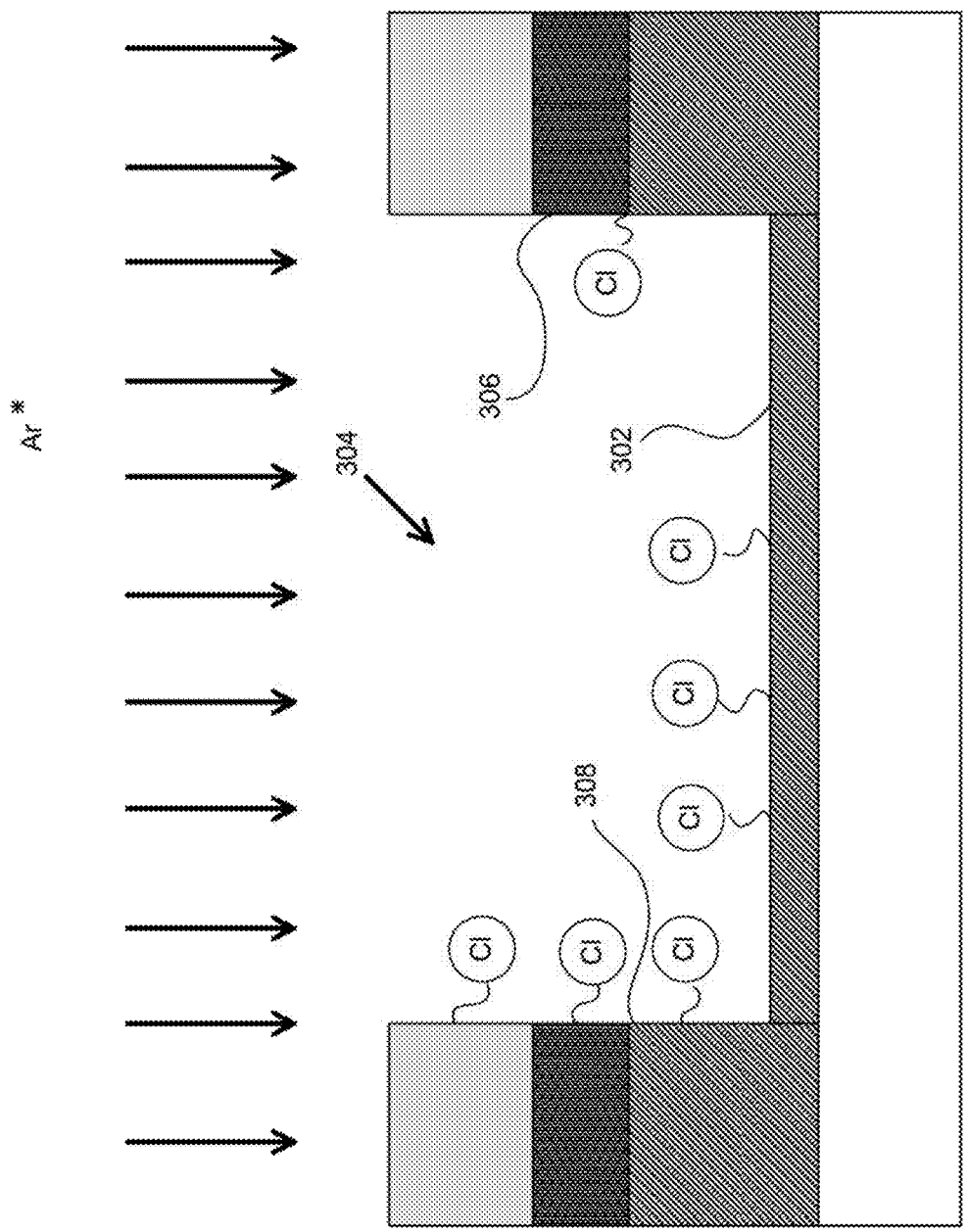
FIG. 3 shows an example of directional etching with metastables in accordance with one or more embodiments of the invention.

The directed flux of Ar* atoms impinges on the features dosed or adsorbed with etchants as mentioned earlier. The Ar* atoms impart the electronic energy to the surface, inducing chemical reactions that result in, for example, etching of the surface at the bottom of the feature, but not on the sidewalk. Upon complete exhaustion of etchants on the surface through Ar* induced etching (or Ar* induced desorption), the etch reaction stops. Since the momentum transfer from the beam of Ar and Ar* impacting the surface is extremely small, substantially no damage occurs to the surface. FIG. 3 shows this vertical etching aspect due to the fact that only vertically directed Ar* atoms impinge on the bottom 302 of feature 304 but not on sidewalls 306 and 308 of Feature 304.

To prevent non-uniform etching of the surface layer due to the hole pattern(s) of separation plate structure 202 and/or collimator plate 226, separation plate structure 202 and/or collimator plate 226 may be moved relative to substrate 228 (or vice versa). The relative lateral movement of separation plate structure 202 and/or collimator plate 226 and/or the wafer & wafer chuck assembly has the effect of preventing the through-hole patterns of separation plate structure 202 or collimator plate 226 from being imprinted only on given areas of the substrate surface.

Generally speaking, the relative lateral movement of separation plate structure 202 and/or collimator plate 226 and/or the wafer & wafer chuck assembly should be sufficient large to ensure as time-average uniform flux of Ar* at all relevant locations on the wafer. In general, the lateral movement amplitude may be at least as large as the distance between the holes in the separation plate, preferably 2× the distance between the holes in the separation plate in one or more embodiments.

Figure 4:
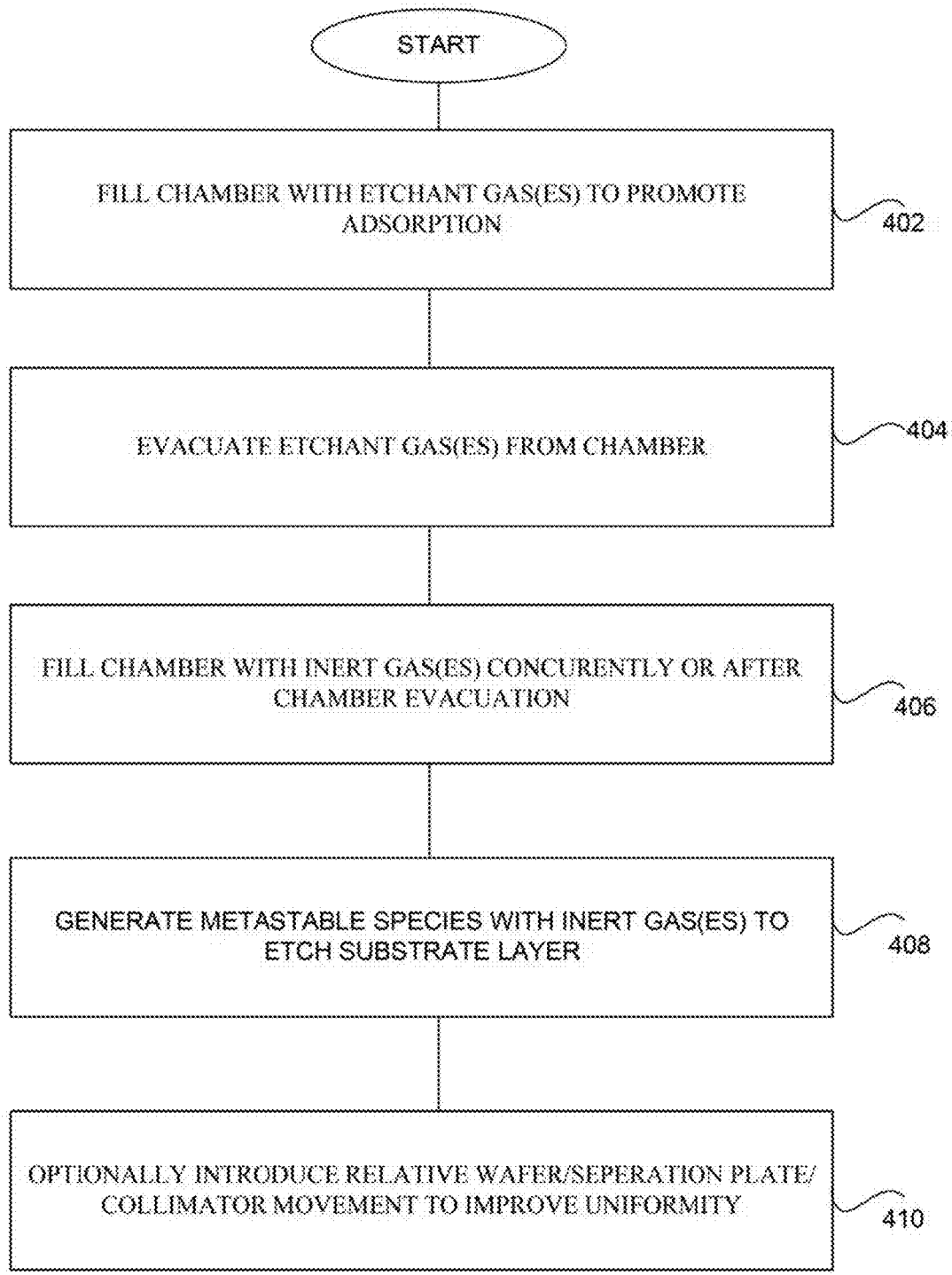
FIG. 4 shows, in accordance with an embodiment of the present invention, the steps for performing atomic layer etching.

FIG. 4 shows, in accordance with an embodiment of the present invention, the steps for performing atomic layer etching. In step 402, the chamber and more particularly the chamber region above the wafer is filled with an etchant source gas to promote adsorption of etchant gas molecules at the substrate surface. In step 404, the etchant gas is evacuated from the chamber and replaced with an inert gas (step 406). The inert gas is then excited and ignited to form a plasma in the plasma generating region to generate metastables (step 408).

As mentioned, the inert gas metastables are employed to etch the substrate layer by inducing a surface reaction at the adsorbed surface of the substrate. A separating plate structure may be employed to prevent the energetic species of the plasma from contacting the substrate surface, thereby minimizing damage or undue etching, or the substrate surface. If desired, a collimator plate may also be employed to further promote etch directionality, resulting in a highly anisotropic etch.

To prevent non-uniform etching of the surface layer due to the hole pattern of the separation plate structure and/or the collimator plate, the separation plate and/or the collimator plate may be moved, in step 410, laterally relative to the substrate (or vice versa). The moving may be performed by a suitable actuator arrangement (which may include a motor and optionally associated gearing), for example.

As can be appreciated from the foregoing, embodiments of the invention employ metastables of an inert gas m activate surface reactions with a substrate layer that has been adsorbed with etchant molecules. By employing the electronic energy of metastables to perform the etch on the substrate's adsorbed surface layer and by preventing the plasma species from bombarding the substrate surface during the atomic layer etch, embodiments of the invention advantageously avoids the bombardment damage caused by energetic species of plasmas when etching highly delicate layers and/or when performing critical atomic layer etches.

While this invention has been described in terms of several preferred embodiments, there are alterations, permutations, and equivalents, which fall within the scope of this invention. If the term "set" is employed herein, such term is intended to have its commonly understood mathematical meaning to cover zero, one, or more than one member. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:

1. A substrate processing system having a substrate processing chamber for etching a layer on a substrate, comprising:
    a substrate support configured to support a substrate in said substrate processing system;
    a separating plate structure separating said substrate processing system into a plasma generating region and a substrate processing region, wherein said separating plate structure has a set of holes configured to permit at least some neutral metastables to migrate through said separating plate structure without colliding with the separating plate structure but substantially prevent energetic plasma species from migrating through the separating plate structure, and wherein the separating plate structure is grounded, wherein the separating plate structure, comprises:
        a top plate, wherein the top plate is grounded, and
        a bottom plate between the top plate and the substrate support;
    a plasma source for generating a plasma in said plasma generating region; and
    a microprocessor, microcontroller, or computer with logic for:
        introducing a first gas into said substrate processing system, said gas being an etchant gas suitable for etching said layer,
        allowing said first gas to be present in said substrate processing system for a period of time sufficient to cause adsorption of at least some of said first gas into said layer,
        substantially replacing said first gas in said substrate processing system with an inert gas,
        generating neutral metastables from said inert gas within said substrate processing region; and
        etching said layer in said substrate processing region with said neutral metastables; wherein said neutral metastables comprise atoms in an excited state.

2. The substrate processing system of claim 1 wherein said metastables are generated by forming a plasma within said substrate processing region from said inert gas using said plasma source.

3. The substrate processing system of claim 2 wherein said metastables traverse said separating plate structure while migrating from said plasma to said layer.

4. The substrate processing system of claim 3 wherein said separating plate structure has a plurality of holes configured for substantially, preventing migration of plasma charged species to said layer.

5. The substrate processing system of claim 3 wherein said top plate and bottom plate are electrically insulated from one another, said top plate and bottom plate having different voltage potentials selected to repel ions emanating from the plasma.

6. The substrate processing system of claim 3 further comprising a collimator plate, wherein said metastables also traverse said collimator plate while migrating from said plasma to said layer, wherein said collimator plate is disposed between said substrate and said separating plate structure.

7. A substrate processing system having a substrate processing chamber for etching a layer on a substrate, said substrate disposed on a chuck within said chamber during said etching, comprising:
    a separating plate structure separating said chamber into a plasma generating region and a substrate processing region, wherein said separating plate structure is grounded and configured with a set of aligned holes sized to permit neutral metastables to migrate through said separating plate structure but substantially prevent energetic plasma species from migrating through the separating plate structure, wherein said neutral metastables comprise atoms in an excited state, wherein the separating plate structure, comprises:
        a top plate, wherein the top plate is grounded, and a bottom plate between the top plate and the substrate support;

a plasma source for generating a plasma in said plasma generating region; and a microprocessor, microcontroller, or computer with logic for:

introducing a first gas into said chamber, said gas being an etchant gas suitable for etching said layer, allowing said first gas to be present in said chamber for a period of time sufficient to cause adsorption of at least some of said first gas into said layer, substantially replacing said first gas in said plasma processing region with an inert gas, generating a plasma from said inert gas in said plasma generating region, and etching said layer with neutral metastables from said plasma, wherein said etching is performed while substantially preventing migration of plasma charged species from said plasma to said layer.

8. The substrate processing system of claim 7 wherein said separating plate structure has a plurality of holes configured for substantially preventing migration of plasma charged species to said layer.

9. The substrate processing system of claim 7 wherein said top plate and bottom plate are electrically insulated from one another, said top plate and bottom plate having different voltage potentials selected to repel ions emanating from the plasma.

10. The substrate processing system of claim 7 further comprising a collimator plate, wherein said metastables also traverse said collimator plate while migrating from said plasma to said layer, wherein said collimator plate is disposed between said substrate and said separating plate structure.

11. The substrate processing system of claim 3 further comprising moving at least one of said separating plate and said substrate relative to one another during said etching with said metastables.

12. The substrate processing system of claim 1 wherein said etchant gas contains at least a halogen and said layer contains Si.

13. The substrate processing system of claim 1 wherein said period of time is between about 0.05 second to about 180 seconds.

14. The substrate processing system of claim 1 wherein said generating said metastables is performed after at least about 90% of said first gas in said chamber is replaced with said inert gas.

15. A substrate processing system having a substrate processing chamber for etching a layer on a substrate, said substrate processing chamber having a plasma generating region and a substrate processing region, said plasma generating region being separated from said substrate processing region by a separating plate structure, comprising:

a separating plate structure separating said chamber into a plasma generating region and a substrate processing region, wherein said separating plate structure is grounded and configured with a set of aligned holes sized to permit neutral metastables to migrate through said separating plate structure but substantially prevent energetic plasma species from migrating through the separating plate structure, wherein said neutral metastables comprise atoms in an excited state, wherein the separating plate structure, comprises:

a top plate, wherein the top plate is grounded, and a bottom plate between the top plate and the substrate support;

a plasma source for generating a plasma in said plasma generating region; and a microprocessor, microcontroller, or computer with logic for:

introducing a first gas into said substrate processing region of said chamber, said first gas being an etchant gas suitable for etching said layer, introducing an inert gas into said plasma generating region, allowing said first gas to be present in said substrate processing region of said chamber for a period of time sufficient to cause adsorption of at least some of said first gas into said layer while maintaining a pressure of said inert gas in said plasma generating region is greater than a pressure of said etchant gas in said substrate processing region, replacing at least 80% of said first gas in said substrate processing region of said chamber with said inert gas after said period of time expires, generating plasma in said plasma generating region of said chamber to generate metastables from said inert gas, and etching said layer with said metastables while maintaining a pressure in said substrate processing region below 10 mTorr.

16. The substrate processing system of claim 15 wherein said metastables traverse said separating plate structure while migrating from said plasma to said layer.

17. The substrate processing system of claim 16 wherein said metastables also traverse a collimator plate while migrating from said plasma to said layer, wherein said collimator plate is disposed between said substrate and said separating plate structure.

18. The substrate processing system of claim 15 wherein said separating plate structure has a plurality of holes configured for preventing migration of at least 60% of plasma charged species generated in said plasma generating from reaching said layer.

19. The substrate processing system of claim 15 wherein said top plate and bottom plate are electrically insulated from one another, said top plate and bottom plate having different voltage potentials during said etching selected to repel ions emanating from the plasma.

20. The system of claim 1, wherein the excited state of an atom of the metastables carries an energy, delivered to said layer, that is greater than a thermal kinetic energy imparted by the atom to said layer.

21. The substrate processing system of claim 1 wherein said separating plate structure has a plurality of holes configured for preventing migration of at least 60% of plasma charged species from reaching said layer.

22. The substrate processing system of claim 1 wherein said separating plate structure has a plurality of holes configured for preventing migration of at least 95% of plasma charged species from reaching said layer.

* * * * *